(12) United States Patent
Maxwell et al.

(10) Patent No.: US 11,137,293 B2
(45) Date of Patent: Oct. 5, 2021

(54) WOUND ELECTRICAL COMPONENT WITH PRINTED ELECTRONICS SENSOR

(71) Applicant: ABB Power Grids Switzerland AG, Baden (CH)

(72) Inventors: Andrew Maxwell, Västerås (SE); Cecilia Forssen, Västerås (SE); Joachim Schiessling, Enköping (SE)

(73) Assignee: ABB Power Grids Switzerland AG, Baden (CH)

(*) Notice: Subject to any disclaimer, the term of this patent is extended or adjusted under 35 U.S.C. 154(b) by 0 days.

(21) Appl. No.: 16/962,092

(22) PCT Filed: Jan. 21, 2019

(86) PCT No.: PCT/EP2019/051358
§ 371 (c)(1),
(2) Date: Jul. 14, 2020

(87) PCT Pub. No.: WO2019/149554
PCT Pub. Date: Aug. 8, 2019

(65) Prior Publication Data
US 2020/0378836 A1 Dec. 3, 2020

(30) Foreign Application Priority Data
Jan. 31, 2018 (EP) .................................... 18154327

(51) Int. Cl.
*G01K 1/14* (2021.01)
*G01R 31/62* (2020.01)
(Continued)

(52) U.S. Cl.
CPC ............... *G01K 1/14* (2013.01); *G01R 31/62* (2020.01); *H01B 17/005* (2013.01); *H01F 27/402* (2013.01); *H01F 2027/406* (2013.01)

(58) Field of Classification Search
CPC .... G01K 1/024; G01K 1/14; G01K 2003/145; G01R 31/62; H01B 17/005; H01B 17/28; H01F 2027/406; H01F 27/402
See application file for complete search history.

(56) References Cited

U.S. PATENT DOCUMENTS

| 5,939,876 A | 8/1999 | Fuglister et al. |
| 8,692,643 B2 * | 4/2014 | Weber ................. H01F 27/2895 |
| | | 336/205 |

(Continued)

FOREIGN PATENT DOCUMENTS

| CN | 202678115 U | 1/2013 |
| CN | 104483995 A | 4/2015 |

(Continued)

OTHER PUBLICATIONS

International Search Report and Written Opinion of the International Searching Authority, PCT/EP2019/0513, dated Apr. 26, 2019, 9 pages.

(Continued)

*Primary Examiner* — Gail Kaplan Verbitsky
(74) *Attorney, Agent, or Firm* — Sage Patent Group

(57) ABSTRACT

A wound electrical component includes a wound body comprising a plurality of wound layers of an electrically insulating material around a longitudinal axis of the body. The component also includes at least one printed electronics sensor consisting of printed circuits on a flexible substrate. Each sensor is interleaved between two of the wound layers of the wound body.

20 Claims, 2 Drawing Sheets

(51) Int. Cl.
*H01B 17/00* (2006.01)
*H01F 27/40* (2006.01)

(56) References Cited

U.S. PATENT DOCUMENTS

| | | |
|---|---|---|
| 9,029,180 B2 | 5/2015 | Britton et al. |
| 2003/0185271 A1* | 10/2003 | Isozumi .................. G01K 3/04 374/45 |
| 2009/0007653 A1* | 1/2009 | Keep .................... G01N 27/223 73/170.19 |
| 2012/0160468 A1* | 6/2012 | Larsson ................ F01N 13/008 165/185 |
| 2013/0293340 A1* | 11/2013 | Weber ................. H01F 27/2895 336/220 |
| 2014/0037956 A1* | 2/2014 | Sopory ................. H01B 7/292 428/368 |
| 2014/0246929 A1* | 9/2014 | Francese ................ H02K 9/22 310/52 |
| 2016/0265978 A1 | 9/2016 | Khatri et al. |
| 2016/0370416 A1 | 12/2016 | Imfeld et al. |
| 2017/0302151 A1* | 10/2017 | Snook ................ H03K 17/0828 |

FOREIGN PATENT DOCUMENTS

| | | |
|---|---|---|
| CN | 106486221 A | 3/2017 |
| KR | 20110102490 A | 9/2011 |
| KR | 20160138691 A | 12/2016 |
| WO | 2015117823 A1 | 8/2015 |

OTHER PUBLICATIONS

Extended European Search Reported dated Jul. 9, 2018 for European Patent Application No. 18154327.3, 4 pages.
Korean Decision for Grant of Patent dated Nov. 23, 2020 for Korean Patent Application No. 10-2020-7022249, 3 pages (including English translation).
Chinese First Office Action dated Jan. 28, 2021 for Chinese Patent Application No. 201980009558.7, 13 pages (including English translation).

* cited by examiner

WOUND ELECTRICAL COMPONENT WITH PRINTED ELECTRONICS SENSOR

CROSS REFERENCE TO RELATED APPLICATIONS

This application is a 35 U.S.C. § 371 national stage application of PCT International Application No. PCT/EP2019/051358 filed on Jan. 21, 2019, which in turns claims foreign priority to European Patent Application No. 18154327.3, filed on Jan. 31, 2018, the disclosures and content of which are incorporated by reference herein in their entirety.

TECHNICAL FIELD

The present disclosure relates to a wound electrical component comprising a sensor.

BACKGROUND

Temperature sensors are useful in high-voltage (HV) transformer bushings for condition monitoring to facilitate for prediction of maintenance intervals, prediction of product failures, and for dynamic thermal rating.

State of the art for temperature sensors in HV products e.g. silicon electronics temperature sensors in power transformers which are installed inside the transformer tank and connected via an optical fibre to the outside. Such sensor systems and their installation are relatively expensive and bulky and are not feasible for smaller/cheaper products like transformer bushings.

U.S. Patent Pub. No. 2016/0370416 A1 discloses a method of determining a reduction of remaining service lifetime, of an electrical device during a specific time period. The device to be tested may e.g. be a distribution transformer of an AC network. The system for determining remaining lifetime comprises temperature sensors connected to a temperature measurement device and a communications modem. The system can be implemented as printed circuit boards.

U.S. Patent Pub. No. 2016/0265978 A1 discloses a sensor assembly for monitoring the temperature of an electrical device. The sensor assembly is positioned within a hollow core in a housing through a hole drilled through surrounding support material.

SUMMARY

It is an objective of the present disclosure to provide an improved way of measuring a temperature, moisture level or other property of a wound electrical component.

According to an aspect of the present disclosure, there is provided a wound electrical component comprising a wound body comprising a plurality of wound layers of an electrically insulating material around a longitudinal axis of the body, and at least one printed electronics sensor consisting of printed circuits on a flexible substrate. Each of the at least one sensor is interleaved between two of the wound layers. The electrical component is for instance a bushing, e.g. transformer bushing, a transformer winding, a capacitor, a cable termination, a wound cable, an instrument transformer, or a machine insulation. Preferably the electrical component is a HV transformer bushing.

According to another aspect of the present disclosure, there is provided an electrical device comprising an embodiment of the wound electrical component of the present disclosure. The electrical device may e.g. be a transformer, e.g. a HV transformer, dry or liquid-filled, comprising the wound electrical component.

According to another aspect of the present disclosure, there is provided a control system of an embodiment of the electrical device of the present disclosure. The control system comprises processing circuitry and a data storage storing instructions executable by said processing circuitry whereby said control system is operative to obtain a temperature from the at least one sensor, measured in real-time; determine that the temperature is below a predetermined maximum temperature of the wound body; and in response to said determination, subjecting the wound electrical component to an electrical current which is above a current rating of said wound electrical component. In addition, in some embodiments, temperature information from temperature sensor may also be used for scheduling maintenance and for predicting life span and risk of breakdown of the electrical component or device.

According to another aspect of the present disclosure, there is provided a method of an embodiment of the electrical device of the present disclosure. The method is for controlled overloading of the wound electrical component comprised in the electrical device. The method comprises obtaining a temperature from the at least one sensor, measured in real-time. The method also comprises determining that the obtained temperature is below a predetermined maximum temperature of the wound body. The method also comprises, in response to said determination, subjecting the wound electrical component to an electrical current which is above a current rating of said wound electrical component.

By using printed electronics for the sensors, e.g. temperature sensors, wherein the sensors are printed onto a flexible substrate, typically a thin flexible substrate of a plastic material, the sensors may be interleaved between layers of the wound body, somethings which would not be possible with conventional sensors mounted on a stiff circuit board. Further, printed sensors may be placed within electrical insulation without disturbing the electrical field. For instance, temperature measurements within e.g. a condenser core of a bushing is made possible.

It is to be noted that any feature of any of the aspects may be applied to any other aspect, wherever appropriate. Likewise, any advantage of any of the aspects may apply to any of the other aspects. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. The use of "first", "second" etc. for different features/components of the present disclosure are only intended to distinguish the features/components from other similar features/components and not to impart any order or hierarchy to the features/components.

BRIEF DESCRIPTION OF THE DRAWINGS

Embodiments will be described, by way of example, with reference to the accompanying drawings, in which.

DETAILED DESCRIPTION

Figure 1:
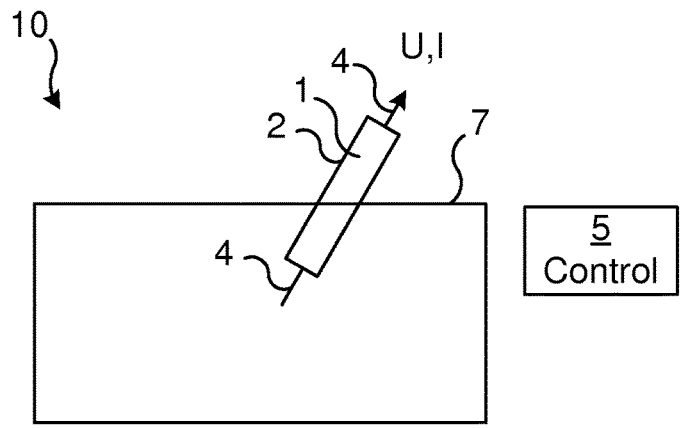
FIG. 1 is a schematic illustration of an embodiment of an electrical device comprising a wound electrical component, in accordance with the present disclosure.

Embodiments will now be described more fully hereinafter with reference to the accompanying drawings, in which certain embodiments are shown. However, other embodiments in many different forms are possible within the scope of the present disclosure. Rather, the following embodiments are provided by way of example so that this disclosure will be thorough and complete, and will fully convey the scope of the disclosure to those skilled in the art. Like numbers refer to like elements throughout the description.

In accordance with embodiments of the present disclosure it is proposed to use printed electronics sensors in wound electrical components, e.g. HV transformer bushings. Herein, a temperature sensor, i.e. the printed electronics sensor comprises a temperature sensing circuit, is discussed as an example of a printed electronics sensor, but any of the printed electronics sensors may alternatively or additionally comprise any other sensor circuit, e.g. a moisture sensing circuit for measuring the moisture level within the wound body and/or an acoustic sensing circuit for measuring sound e.g. of partial electrical discharges within the wound body. For instance, a temperature sensing circuit, e.g. InFlect™ temperature sensor or other circuitry realized by e.g. ink jet printing on the flexible substrate e.g. based on resistance measurements. Additionally or alternatively, a moisture sensing circuit, e.g. based on resistance measurements such as InFlect™ moisture sensor or based on humidity sensitive polymer and capacitance measurements such as a fully printed flexible humidity sensor, may e.g. be used for detecting ageing of the electrically insulating material due to moisture uptake. Additionally or alternatively, an acoustic sensing circuit, e.g. based on piezo electric ink such as pressure sensors for printed blast dosimeters or other printed acoustic sensor, may be used e.g. for detection and/or localization of partial discharges. However, it is preferred that at least some of the at least one printed electronics sensor comprises a temperature sensing circuit for measuring a temperature in the wound body. Such sensors are available on the market and are cheaper than silicon based sensors. Thanks to their smaller thickness they could seamlessly match into the component geometry without disturbing the electric field distribution of the wound body. In addition, they could be installed in a standard production process in the shape of a plastic/paper film/tape without adding much extra work.

The printed sensor may be combined with printed electronics radio communication components to transmit information. On the same film/tape there could be printed radio communication devices connected to or comprised in the sensor circuitry. The sensor could be axially placed in a high-temperature region inside the wound body, e.g. condenser core, and the communication device could be axially placed outside the wound body to avoid damping/shielding effects of the epoxy/foils for the radio communication. In addition to a sensor circuit, e.g. a temperature sensing circuit, also other printed electronics sensor circuit(s) may be used in addition to temperature sensing circuit, possibly arranged on the same substrates as the temperature sensing circuits. Such additional sensor circuit(s) may e.g. include a moisture sensing circuit.

FIG. 1 is a schematic side-view in section of an embodiment of an electrical device 10, here in the form of a power transformer comprising a transformer tank, a control system 5 and a wound electrical component 1, here in the form of a bushing, passing through a wall of the electrical device 10. The bushing 1 comprises a wound body 2, e.g. a condenser core, of an electrically insulating material and is arranged to allow an electrical conductor 4, conducting a current I and voltage U, to pass through the wall 7. Herein, the conductor 4 also represents a central longitudinal axis 4 of the wound electrical component 1. The control system is arranged to i.a. control the current I passing through the wound electrical component 1, and thus, indirectly, control the temperature of said wound electrical component 1, heat being formed in the wound electrical component as a function of the current I and the resistance of the conductor 4.

The electrical component 1 may be any electrical device comprising a wound body 2. For instance, the electrical component may be any of a bushing, e.g. transformer bushing, a transformer winding, a capacitor, a cable termination, a wound cable, machine insulation or an instrument transformer. Embodiments of the present disclosure may be especially useful for HV electrical devices 10, e.g. having a voltage rating within the range of 52-1100 kV. Further, the wound electrical component 1 comprised in the electrical device may also have a voltage rating within the range of 52-1100 kV and thus configured for HV applications.

Figure 2:
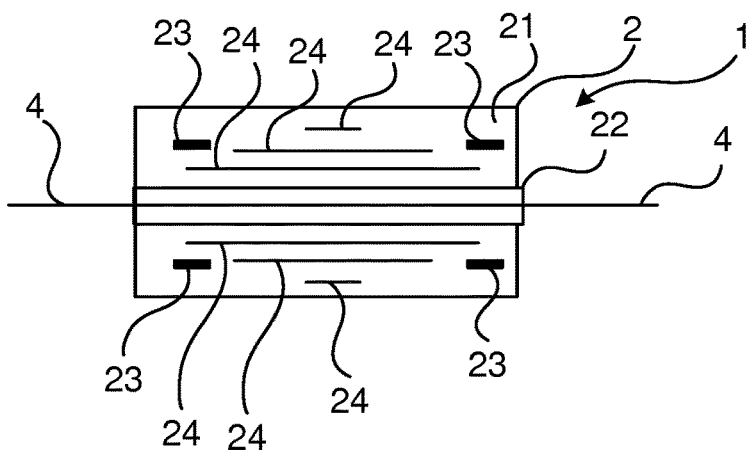
FIG. 2 is a schematic illustration of an embodiment of a wound electrical component, in longitudinal section, in accordance with the present disclosure.

FIG. 2 illustrates a wound electrical component 1 in longitudinal section, e.g. a bushing as in FIG. 1. The component 1 comprises a wound body 2 of an electrically insulating material 21. A conductor, representing a central longitudinal axis of the component as well as its wound body, 4 passes through a longitudinal through hole provided by a pipe 22 around which a web (e.g. a paper web or thermoplastic film) of the material 21 has been wound to form layers of the wound body 2. At least one, here a plurality of, one printed electronics sensors 23 are positioned inside the wound body 2, interleaved between layers of the body. Optionally, depending on the type of component 1, at least one, here a plurality of, electrically conducting foils 24 are also positioned inside of the body, interleaved between layers of the body, to adjust/control the electrical field. As an alternative to conducting foils 24, conducting layers or electrodes corresponding to said foils may be provided in other ways than by interleaving foils. The conducting layers may e.g. be printed or painted on or between layers of the body. Preferably, the at least one printed electronics sensor 23 comprises a plurality of printed electronics sensors 23, at different axial, and optionally radial, positions along the longitudinal axis 4.

The sensors 23 may conveniently be positioned in the body 2 such that they are able to measure the temperatures of e.g. hotspots or temperature distribution within the body. Additionally or alternatively, the sensors 23 may conveniently be positioned in the body 2 such that they are able to communicate with the outside of the component 1, e.g. wirelessly, without interference from any electrically conducting foils 24.

In some embodiments, the electrically insulating material 21 is cellulose based, such as paper based, e.g. as Oil-Impregnated Paper, OIP, or Resin-Impregnated Paper, RIP, preferably epoxy impregnated paper, or based on a synthetic polymer. Layers of a paper may thus have been wound around the pipe 22 to form the wound body 2, after which the wound paper has been impregnated with e.g. oil, resin (e.g. epoxy) or any other electrically insulating, and optionally curable, fluid. Alternatively, the electrically insulating material may be a thermoplastic material, whereby the wound body 2 has been formed by winding and laminating a film of the thermoplastic material.

The component 1 may be relatively large in size, especially if configured for HV applications, e.g. having a length within the range of from 30 cm to 10 or 20 M.

Figure 3:
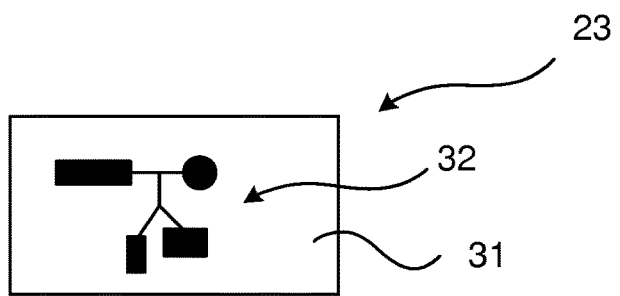
FIG. 3 is a schematic illustration of an embodiment of a printed electronics sensor, in accordance with the present disclosure.

FIG. 3 schematically illustrates a printed electronics sensor 23 comprising or consisting of printed electronics circuits 32 printed onto a flexible substrate 31.

The flexible substrate may be of a plastic or cellulose based material, e.g. paper, preferably a plastic material. The material of the substrate 31 should be resistant to the operating temperature of the component 1, and may thus preferably be a high temperature resistant plastic material. To seamlessly integrate in the wound body, the substrate 31 is preferably a thin flexible film, e.g. having a thickness of at most 100 μm, e.g. less than 70 or 60 μm. In an embodiment, the substrate 31 has a thickness of about 50 μm (micrometres).

For communication with and/or for powering of each sensor 23, the sensor may be connected by wiring and/or optical fibres. However, since the sensor 23 is integrated between layers of the wound body 2, it may not be convenient with such structural connections between the sensor and the outside of the body. Instead, the printed circuits 32 may comprise a communication circuit for wireless communication and/or a power circuit for energy storage/supply to power the sensor, in addition to a temperature sensing circuit. The communication circuit may comprise a circuit in accordance with a Local Area Network (LAN) e.g. Wi-Fi, standard, or a Bluetooth, e.g. Bluetooth Low Energy (BLE) standard, and/or the communication circuit may comprise a circuit for a passive or active Radio-Frequency Identification (RFID) tag. A passive RFID tag collect energy from a nearby RFID reader's interrogating radio waves. In contrast, an active tag has a local power source (such as a battery). The power circuit may e.g. comprise a printed battery, printed onto the substrate 31, and/or the power circuit may comprise an energy harvesting circuit configured to generate electrical power from an electrical field formed when the wound electrical component 1 is used.

Figure 4:
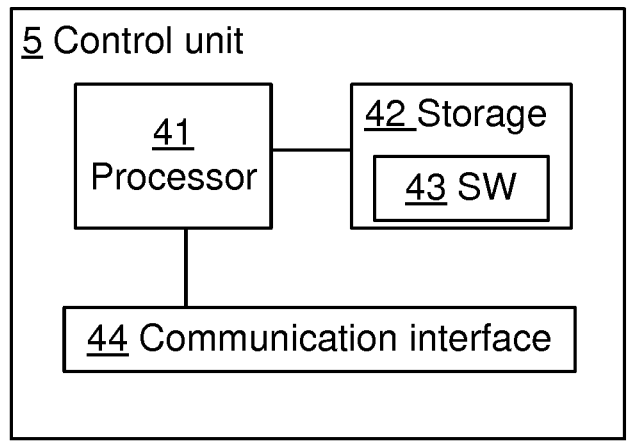
FIG. 4 is a schematic block diagram of an embodiment of a control system in accordance with the present disclosure.

FIG. 4 is a schematic block diagram of an embodiment of a control system 5 of the electrical device 10. The control system comprises processing circuitry 41 e.g. a central processing unit (CPU). The processing circuitry 41 may comprise one or a plurality of processing units in the form of microprocessor(s). However, other suitable devices with computing capabilities could be comprised in the processing circuitry 41, e.g. an application specific integrated circuit (ASIC), a field programmable gate array (FPGA) or a complex programmable logic device (CPLD). The processing circuitry 41 is configured to run one or several computer program(s) or software (SW) 43 stored in a data storage 42 of one or several storage unit(s) e.g. a memory. The storage unit is regarded as a computer readable means as discussed herein and may e.g. be in the form of a Random Access Memory (RAM), a Flash memory or other solid state memory, or a hard disk, or be a combination thereof. The processing circuitry 41 may also be configured to store data in the storage 42, as needed. The control system 5 may also comprise a wired or wireless communication interface 44 for e.g. sending control signals to other parts of the electrical device 10 for controlling the same, e.g. for controlling the current I through the wound component 1.

The control system may control the electrical device 10 based on e.g. the temperatures measured by the printed sensors 23. For instance, the measured temperatures may give information usable for determining the life span or health of the wound electrical component 1, e.g. for when it is time to replace or service the component. Further, real-time temperature measurements from the sensors 23 may give a more precise indication of the electrical current load which the component 1 may be subjected to at any time, which may be different from the standard (fixed, e.g. specified by the manufacturer) current rating of the component. Thus, the temperature measurements may be used for determining the maximum load (current) which is allowed, and this load may be above the rating of the component 1. Apart from the current, other factors which may affect the temperature measured in the wound body 2 include ambient conditions, e.g. temperature, as well as heat dissipation in the electrically insulating material 21. The use of temperature sensors 23 for obtaining real-time temperature measurements of the body 2 may thus allow for dynamic loading of the component 1 based on said temperature measurements, rather than static loading based on the rating of the component. Since the rating is for security reasons made rather conservative, overloading of the component 1 may be enabled in a secure manner thanks to the temperature measurements during time periods when the measured temperature does not exceed a pre-set maximum temperature.

Thus, the control system 5 may be configured, by means of stored instructions, i.e. SW 43, to obtain a temperature from the at least one sensor 23, measured in real-time; determine that the temperature is below a predetermined maximum temperature of the wound body 2; and in response to said determination, subjecting the wound electrical component 1 to an electrical current I which is above a current rating of said wound electrical component. The control system 5 may be centrally located or distributed at a distance from the device 10, and/or co-located with the device.

Figure 5:
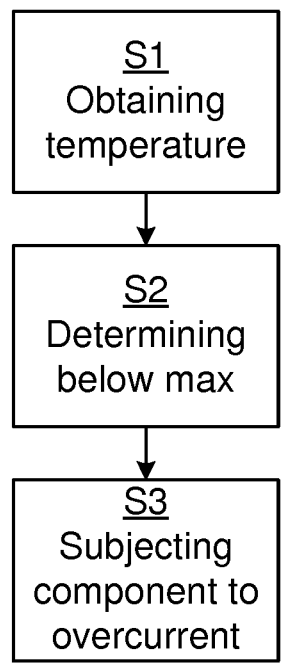
FIG. 5 is a schematic flow chart of an embodiment of a method of the present disclosure.

FIG. 5 is a flow chart of an embodiment of a method of the present disclosure. The method is performed in an electrical device 10 as discussed herein, e.g. by the control system 5 thereof which may be co-located with and/or located some distance from the electrical component 1 and/or other parts of the electrical device 10, for enabling controlled overloading of the wound electrical component 1 comprised in the electrical device 10. The method comprises obtaining S1 a temperature from the at least one sensor 23, measured in real-time. The method also comprises determining S2 that the obtained S1 temperature is below a predetermined maximum temperature of the wound body 2. The method also comprises, in response to said determination S2, subjecting S3 the wound electrical component 1 to an electrical current I which is above a current rating of said wound electrical component.

Embodiments of the present disclosure may be conveniently implemented using one or more conventional general purpose or specialized digital computer 5, computing device, machine, or microprocessor, including one or more processors 41, memory and/or computer readable storage media 42 programmed according to the teachings of the present disclosure.

Appropriate software 43 coding can readily be prepared by skilled programmers based on the teachings of the present disclosure, as will be apparent to those skilled in the software art.

In some embodiments, the present disclosure includes a computer program product 42 which is a non-transitory storage medium or computer readable medium (media) having instructions 43 stored thereon/in which can be used to program a computer 5 to perform any of the methods/processes of the present disclosure. Examples of the storage medium 42 can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data 43.

The present disclosure has mainly been described above with reference to a few embodiments. However, as is readily appreciated by a person skilled in the art, other embodiments than the ones disclosed above are equally possible within the scope of the present disclosure, as defined by the appended claims.

The invention claimed is:

1. A wound electrical component comprising:
   a wound body comprising a plurality of wound layers of an electrically insulating material around a longitudinal axis of the wound body; and
   at least one printed electronics sensor consisting of printed circuits on a flexible substrate,
   wherein each of the at least one sensor is interleaved between two of the wound layers.

2. The wound electrical component of claim 1, wherein the printed circuits comprise at least one of: a temperature sensing circuit, an acoustic sensing circuit and a moisture sensing circuit.

3. The wound electrical component of claim 1, wherein the printed circuits comprise a circuit for wireless communication.

4. The wound electrical component of claim 1, wherein the printed circuits comprise an energy harvesting circuit configured to generate electrical power from an electrical field formed when the wound electrical component is used.

5. The wound electrical component of claim 1, wherein the wound electrical component is configured for high-voltage, HV, applications, e.g. having a voltage rating within a range of 52-1100 kV.

6. The wound electrical component of claim 1, wherein the electrically insulating material comprises at least one of a cellulose based material or a synthetic polymer.

7. The wound electrical component of claim 1, wherein an electrically conducting foil is interleaved between some of the wound layers of the wound body, or wherein conducting layers are printed or painted on some of the wound layers of the wound body.

8. The wound electrical component of claim 1, wherein the flexible substrate is a film having a thickness of at most 100 μm.

9. The wound electrical component of claim 1, wherein the flexible substrate is resistant to an operating temperature of the wound electrical component.

10. The wound electrical component of claim 1, wherein the flexible substrate is of a plastic material.

11. The wound electrical component of claim 1, wherein the at least one printed electronics sensor comprises a plurality of printed electronics sensors, at different axial, and optionally radial, positions along the longitudinal axis.

12. The wound electrical component of claim 1, wherein the component comprises at least one of a bushing, a transformer bushing, a transformer winding, a capacitor, a cable termination, a wound cable, machine insulation, an instrument transformer, or a HV transformer bushing.

13. An electrical device comprising the wound electrical component of claim 1.

14. The electrical device of claim 13, further comprising a control system comprising processing circuitry and a data storage storing instructions executable by said processing circuitry whereby said control system is operative to:
   obtain a temperature from the at least one sensor, measured in real-time;
   determine that the temperature is below a predetermined maximum temperature of the wound body; and
   in response to said determination, subjecting the wound electrical component to an electrical current which is above a current rating of said wound electrical component.

15. A method of controlled overloading of a wound electrical component of an electrical device, wherein the wound electrical component comprises: a wound body comprising a plurality of wound layers of an electrically insulating material around a longitudinal axis of the wound body; and at least one printed electronics sensor consisting of printed circuits on a flexible substrate, wherein each of the at least one sensor is interleaved between two of the wound layers, the method comprising:
   obtaining a temperature from the at least one sensor, measured in real-time;
   determining that the obtained temperature is below a predetermined maximum temperature of the wound body; and
   in response to said determination, subjecting the wound electrical component to an electrical current which is above a current rating of said wound electrical component.

16. The wound electrical component of claim 2, wherein the printed circuits comprise a temperature sensing circuit.

17. The wound electrical component of claim 3, wherein the circuit for wireless communication is accordance with a Local Area Network (LAN) standard comprising at least one of a Wi-Fi, standard, a Bluetooth standard, a Bluetooth Low Energy (BLE) standard, a passive Radio-Frequency Identification (RFID) tag, or an active RFID tag.

18. The wound electrical component of claim 6, wherein the electrically insulating material comprises epoxy impregnated paper.

19. The wound electrical component of claim 8, wherein the film has a thickness of less than 70 μm.

20. The wound electrical component of claim 19, wherein the film has a thickness of less than 60 μm.

* * * * *